United States Patent
Parimi et al.

(10) Patent No.: US 11,600,470 B2
(45) Date of Patent: Mar. 7, 2023

(54) TARGETED HEAT CONTROL SYSTEMS

(71) Applicant: Applied Materials, Inc., Santa Clara, CA (US)

(72) Inventors: Venkata Sharat Chandra Parimi, Sunnyvale, CA (US); Satish Radhakrishnan, San Jose, CA (US); Xiaoquan Min, Cupertino, CA (US); Sarah Michelle Bobek, Santa Clara, CA (US); Sungwon Ha, Palo Alto, CA (US); Prashant Kumar Kulshreshtha, San Jose, CA (US); Vinay Prabhakar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 437 days.

(21) Appl. No.: 16/728,552

(22) Filed: Dec. 27, 2019

(65) Prior Publication Data

US 2021/0202218 A1 Jul. 1, 2021

(51) Int. Cl.
*H01J 37/32* (2006.01)
*H01L 21/02* (2006.01)
(Continued)

(52) U.S. Cl.
CPC ........ *H01J 37/32651* (2013.01); *C23C 16/26* (2013.01); *C23C 16/50* (2013.01);
(Continued)

(58) Field of Classification Search
CPC ................................................ H01J 37/32715
See application file for complete search history.

(56) References Cited

U.S. PATENT DOCUMENTS

| | | | |
|---|---|---|---|
| 6,086,680 A * | 7/2000 | Foster | H01L 21/68785 118/728 |
| 6,188,044 B1 * | 2/2001 | Lee | C23C 16/481 219/390 |

(Continued)

FOREIGN PATENT DOCUMENTS

| | | |
|---|---|---|
| JP | 2009-123656 A | 6/2009 |
| WO | 2019-033052 A1 | 2/2019 |

OTHER PUBLICATIONS

International Search Report and Written Opinion dated Apr. 12, 2021 in International Patent Application No. PCT/US2020/065372, 7 pages.

(Continued)

*Primary Examiner* — Keath T Chen
(74) *Attorney, Agent, or Firm* — Kilpatrick Townsend & Stockton LLP

(57) ABSTRACT

Exemplary semiconductor processing chambers may include a chamber body including sidewalls and a base. The chambers may include a substrate support extending through the base of the chamber body. The substrate support may include a support platen configured to support a semiconductor substrate. The substrate support may include a shaft coupled with the support platen. The substrate support may include a shield coupled with the shaft of the substrate support. The shield may include a plurality of apertures defined through the shield. The substrate support may include a block seated in an aperture of the shield.

20 Claims, 5 Drawing Sheets

(51) Int. Cl.
*C23C 16/26* (2006.01)
*C23C 16/50* (2006.01)

(52) U.S. Cl.
CPC .. *H01J 37/32715* (2013.01); *H01L 21/02274* (2013.01); *H01J 2237/3321* (2013.01); *H01J 2237/3323* (2013.01)

(56) References Cited

U.S. PATENT DOCUMENTS

| | | | |
|---|---|---|---|
| 2002/0078889 A1* | 6/2002 | Welch | H01L 21/67259 |
| | | | 118/668 |
| 2009/0175606 A1* | 7/2009 | Bezama | H01L 21/6875 |
| | | | 438/795 |
| 2012/0027646 A1* | 2/2012 | Yarlagadda | C30B 29/406 |
| | | | 422/245.1 |
| 2013/0126515 A1 | 5/2013 | Shero et al. | |
| 2014/0004716 A1 | 1/2014 | Koelmel et al. | |
| 2019/0385872 A1 | 12/2019 | Ranish et al. | |

OTHER PUBLICATIONS

Application No. PCT/US2020/065372, International Preliminary Report on Patentability, dated Jul. 7, 2022, 5 pages.

* cited by examiner

TARGETED HEAT CONTROL SYSTEMS

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

SUMMARY

Exemplary semiconductor processing chambers may include a chamber body including sidewalls and a base. The chambers may include a substrate support extending through the base of the chamber body. The substrate support may include a support platen configured to support a semiconductor substrate. The substrate support may include a shaft coupled with the support platen. The substrate support may include a shield coupled with the shaft of the substrate support. The shield may include a plurality of apertures defined through the shield. The substrate support may include a block seated in an aperture of the shield.

In some embodiments, the shield may be or include a ceramic material. The substrate support may include a purge channel positioned to deliver a purge gas within a region between the support platen and the shield. Each aperture of the plurality of apertures may be characterized by a diameter of less than or about 10 mm. The plurality of apertures may be sized along a gradient, and apertures proximate the shaft may be characterized by a larger diameter than apertures distal the shaft. The plurality of apertures may be defined within an area confined by a radial distance of 80% or less of a radius of the shield. The shield may be positioned within 30 mm along the shaft of a backside of the support platen. The block may be or include a material that is substantially opaque to infrared radiation. The block may include a first block, the aperture of the shield in which the first block is seated may be a first aperture, and the semiconductor processing system may include a second block seated in a second aperture of the shield. The second block may be or include a material that is substantially transparent to infrared radiation.

Some embodiments of the present technology may encompass a semiconductor processing chamber pedestal radiation shield. The shield may include a ceramic material and a block. The shield may define a central aperture coaxial with a central axis of the shield. The shield may define a plurality of apertures uniformly spaced about the central aperture. The block may extend across at least one aperture of the plurality of apertures. The plurality of apertures may be defined within an area confined by a radial distance of 90% or less of a radius of the shield. The block may be or include a material that is substantially opaque to infrared radiation. The block may extend across multiple apertures of the plurality of apertures. The block may be a first block, the at least one aperture across which the first block extends may be a first aperture, and the shield may include a second block extending across a second aperture of the shield. The second block may be a material that is substantially transparent to infrared radiation. The second block may be or include quartz or sapphire.

Some embodiments of the present technology may encompass methods of semiconductor processing. The methods may include flowing a carbon-containing precursor into a processing chamber. The processing chamber may include a faceplate and a substrate support on which a substrate is disposed. The substrate support may extend through a base of the processing chamber. The substrate support may include a support platen on which the substrate is disposed. The substrate support may include a shaft coupled with the support platen. The substrate support may include a shield coupled with the shaft of the substrate support. The shield may have a plurality of apertures defined through the shield. The substrate support may include a block covering at least one aperture of the plurality of apertures. The methods may include generating a plasma of the carbon-containing precursor within the processing chamber. The methods may include depositing a carbon-containing material on the substrate.

In some embodiments, the substrate support may be maintained at a temperature of at least about 600° C. during the method. The block may be or include a material that is substantially opaque to infrared. The block may increase a local temperature of the substrate support at a location vertically offset and axially aligned with the block. The block may be a first block, the at least one aperture covered by the first block may be a first aperture, the substrate support may include a second block covering a second aperture of the shield, and the second block may be a material that is substantially transparent to infrared radiation. The second block may decrease a local temperature of the substrate support at a location vertically offset and axially aligned with the second block.

Such technology may provide numerous benefits over conventional systems and techniques. For example, embodiments of the present technology may improve temperature uniformity across a substrate. Additionally, the components may allow modification to accommodate any number of chambers or processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
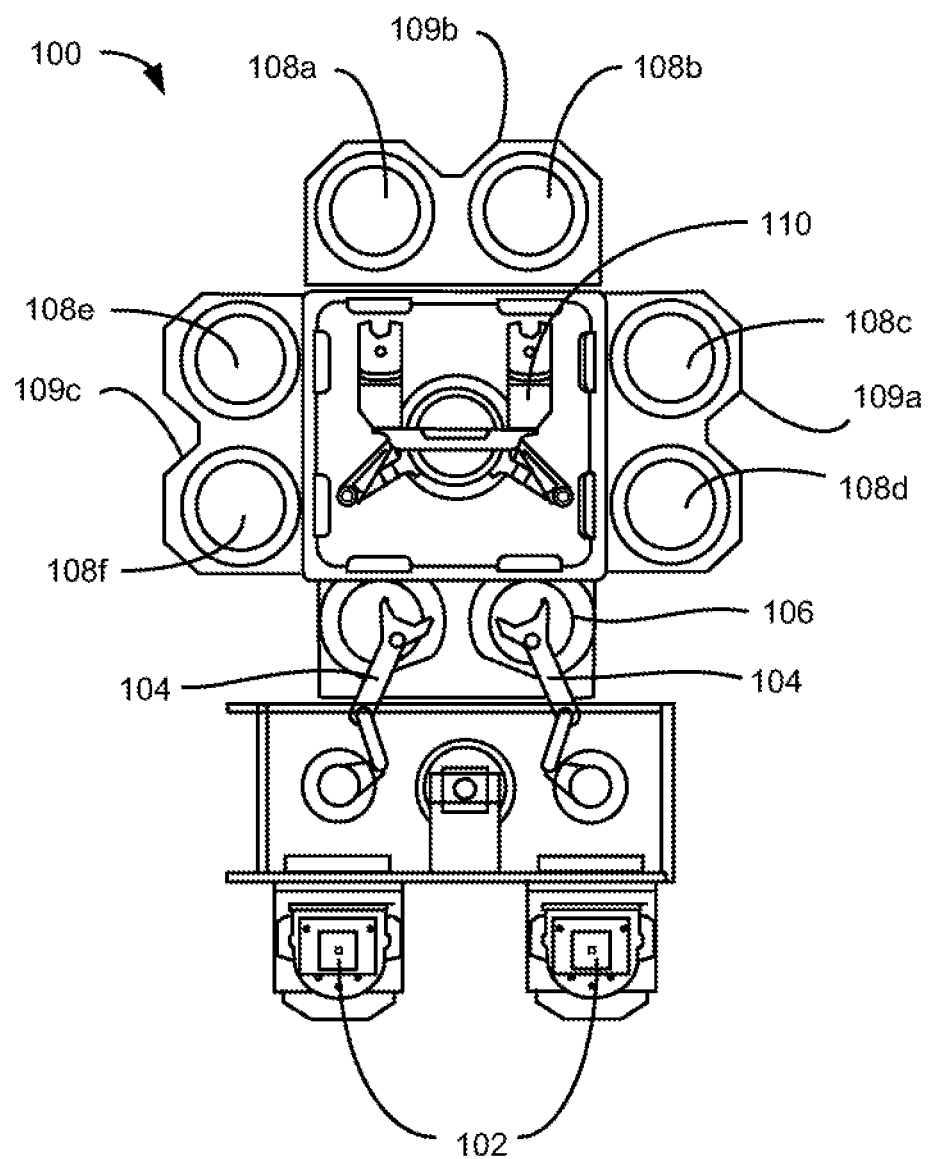
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film uniformity differences across the substrate for materials produced or removed. For example, a substrate support or heater on which a substrate is disposed may include one or more heating mechanisms to heat a substrate. When heat is delivered or lost differently between regions of a substrate, the deposition may be impacted where, for example, warmer portions of the substrate may be characterized by thicker deposition or different film properties relative to cooler portions.

In some non-limiting examples of deposition processes, temperature sensitive applications may be further impacted. For example, some carbon-containing films may be deposited or formed at relatively higher temperatures, such as above or about 500° C., above or about 550° C., above or about 600° C., above or about 650° C., or above or about 700° C., or higher. At these temperatures, radiative losses across a wide range of frequencies may increase quickly, as radiative emission increases with temperature by a power of four. For example, where the process may be performed at only twice some other processing temperatures, the thermal radiation from the pedestal or other components may increase by a factor of sixteen. Accordingly, at these higher temperatures, thermal uniformity may be more challenging to maintain, as even small differences may incur substantial heat loss. This will be described in more detail below.

The present technology overcomes these challenges during these higher temperature processes, as well as for any other process that may benefit from improved temperature uniformity. By utilizing a modular radiation shield, increased control of heat loss within any particular chamber may be afforded. Accordingly, the present technology may produce improved film deposition characterized by improved thickness and material property uniformity across a surface of the substrate.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
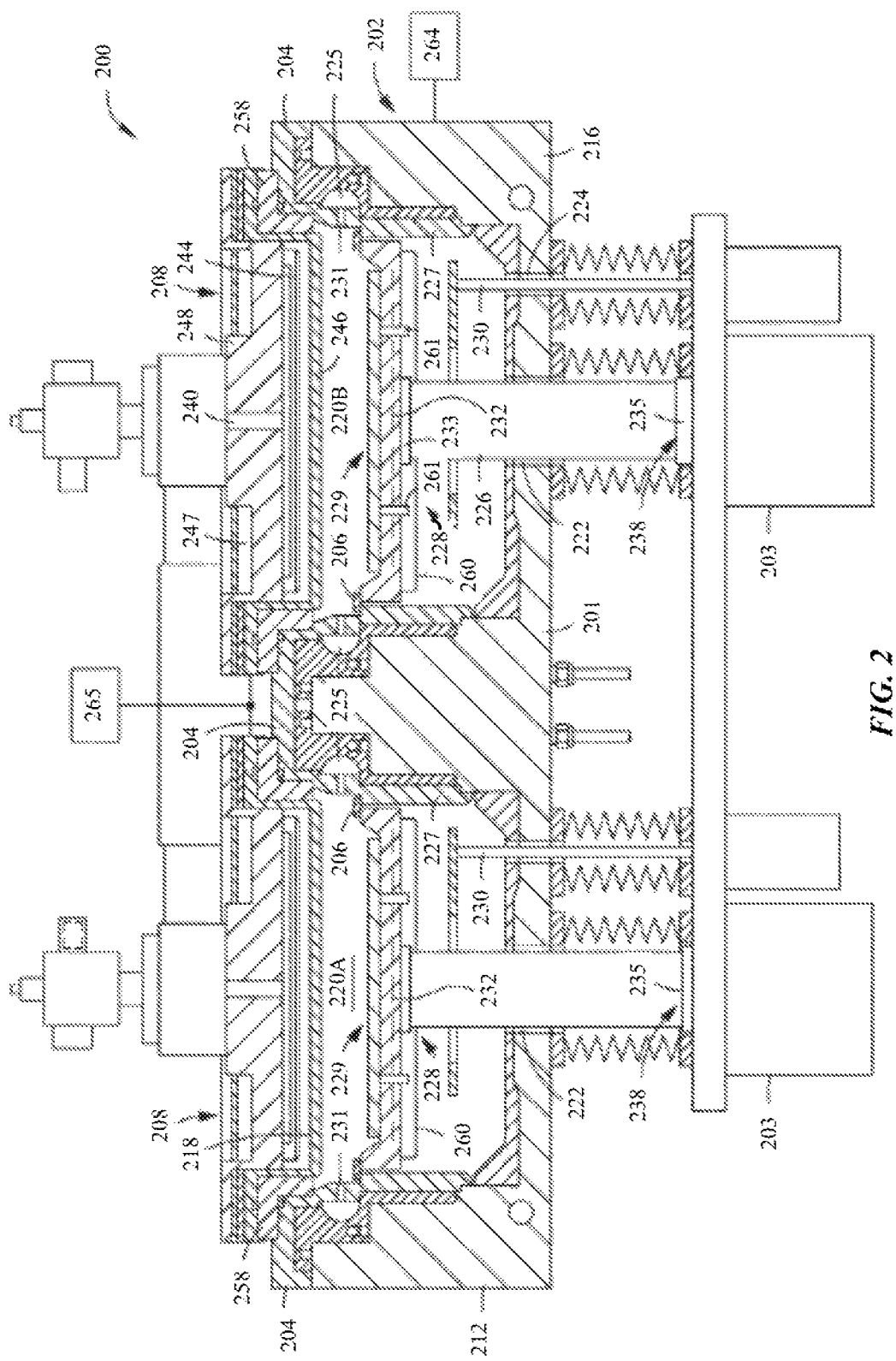
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
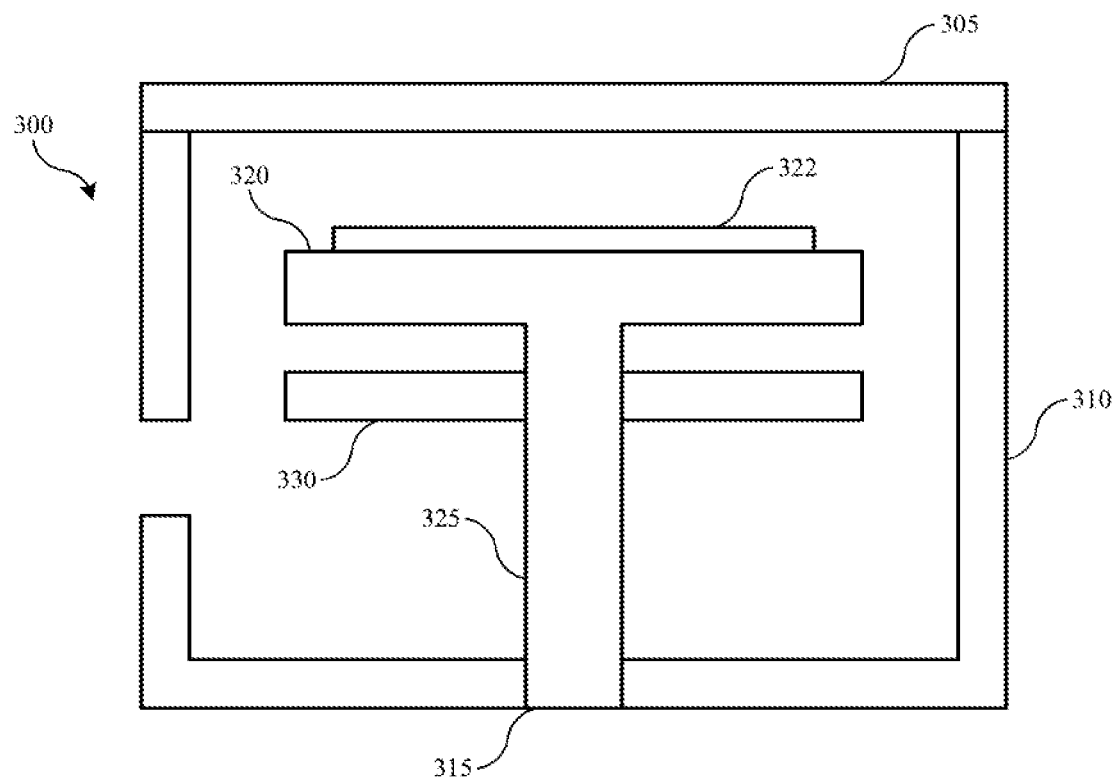
FIG. 3 shows a schematic cross-sectional view of an exemplary processing chamber according to some embodiments of the present technology.

FIG. 3 shows a schematic partial cross-sectional view of an exemplary processing system 300 according to some embodiments of the present technology. FIG. 3 may illustrate further details relating to components in system 200, such as for pedestal 228. System 300 is understood to include any feature or aspect of system 200 discussed previously in some embodiments. The system 300 may be used to perform semiconductor processing operations including deposition of hardmask materials as previously described, as well as other deposition, removal, and cleaning operations. System 300 may show a partial view of the chamber components being discussed and that may be incorporated in a semiconductor processing system, and may illustrate a view across a center of the faceplate, which may otherwise be of any size, and include any number of apertures. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma within the processing region of the chamber. The chamber may also include a chamber body 310, which as illustrated may include sidewalls and a base. A pedestal or substrate support 315 may extend through the base of the chamber as previously discussed. The substrate support may include a support platen 320, which may support semiconductor substrate 322. The support platen 320 may be coupled with a shaft 325, which may extend through the base of the chamber. System 300 may also incorporate a shield 330, such as a heat shield or radiation shield, which may be coupled about or with the shaft 325 of the substrate support 315.

As previously explained, thermal uniformity may be challenged in any processing chamber, and for higher temperature processes, radiative losses may be substantially greater. Continuing the non-limiting example explained previously, some carbon-film deposition may be performed at temperatures above 600° C., or higher, which may facilitate adsorption of carbon radicals on a surface of the substrate. To maintain these processing temperatures, the substrate support, such as substrate support 315, may include one or more heating elements, which may be enabled to produce substrate or platen temperatures that may be greater than or about 500° C., and may be greater than or about 525° C., greater than or about 550° C., greater than or about 575° C., greater than or about 600° C., greater than or about 625° C., greater than or about 650° C., greater than or about 675° C., greater than or about 700° C., greater than or about 725° C., greater than or about 750° C., greater than or about 775° C., greater than or about 800° C., or higher.

While the substrate and aspects of the support may be maintained at higher temperatures, the chamber body 310 may be maintained at lower temperatures, such as below or about 100° C. or lower. This may create a heat sink that can affect the temperature profile across the substrate. For example, edge regions of the substrate or support may have higher losses to the sidewalls of the chamber, which may lower a substrate temperature radially about the substrate. This lower temperature in a radial band may produce a first kind of non-uniformity, which may exist in a band about the substrate. Similarly, as illustrated in the figure, a slit valve or chamber access may be positioned or defined through a portion of the chamber body. This access may be characterized by a lower temperature than other aspects of the chamber body, which may create a localized heat sink. This lower temperature in a region may create a planar non-uniformity, where a section of substrate may be characterized by lower temperature.

Temperature at the substrate may be closely correlated to the extinction coefficient of the film, accordingly, temperature fluctuations across the film, which may result in thickness variations, may also result in extinction coefficient variation across the film, which may impact subsequent lithography or etching operations. A shield 330 incorporated below the substrate support may at least partially protect against the thermal variation from radiative heat losses. By utilizing a shield material that may be more opaque to radiative heat losses, the shield may protect from losses to the chamber base as well. However, a solid shield may cause additional issues with temperature uniformity.

Figure 4:
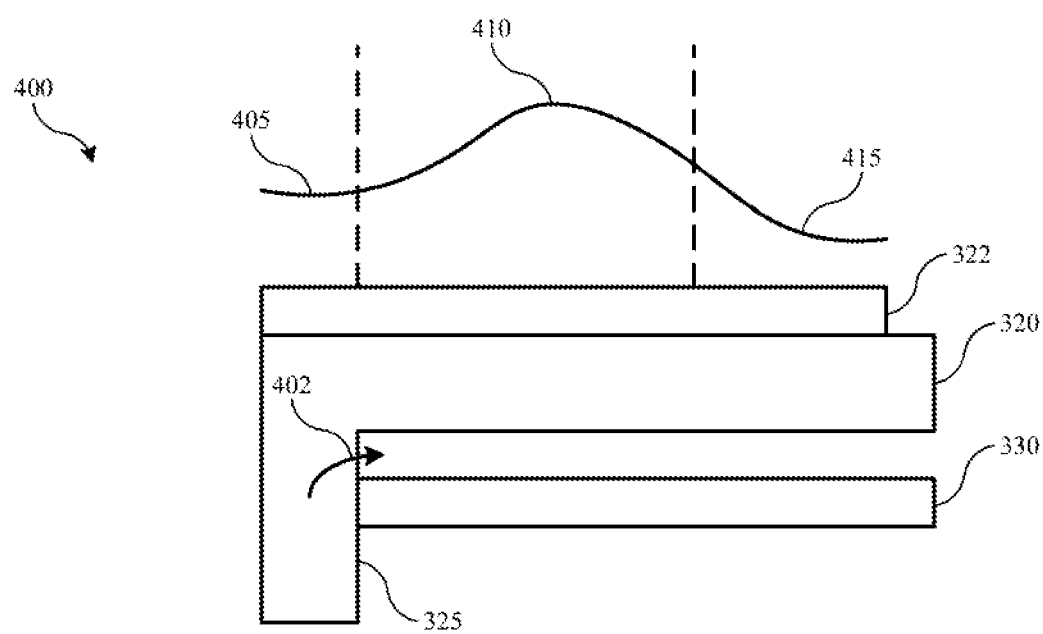
FIG. 4 shows a schematic partial cross-sectional view of chamber components according to some embodiments of the present technology.

FIG. 4 shows a schematic partial cross-sectional view of chamber components 400 according to some embodiments of the present technology, and may show a partial view of the substrate support 315 described above. For example, the figure illustrates a portion of the support platen 320 of a substrate support, and a portion of a stem or shaft of the pedestal. Substrate 322 may be disposed on the platen, and shield 330 may be coupled with the shaft 325. Additionally illustrated is a flow path 402. Flow path 402 may be a channel included through shaft 325, and which may deliver a purge gas between the bottom of the support platen and the shield. This may limit intrusion of deposition precursors that may deposit on the shield, and may be difficult to clean. As noted above, a shield may provide thermal protection from slit valve losses, as well as losses to a pumping region which may be near the base. However, a solid shield may be limited in an ability to affect non-uniformity, and may allow other losses. Above the substrate is a line illustrating film deposition non-uniformity from some exemplary depositions. As shown, at a center of the wafer, the deposition may be lower from a first temperature effect, as illustrated in section 405. For example, the shaft may produce conductive heat losses, which may lower the center temperature.

Additionally, at an edge region, a larger view factor may occur to the cooler chamber walls, which may cause greater radiative heat losses, and even lower deposition, as illustrated in section 415. Although the shield 330 may partially reduce these effects, the same shield may cause issues in a middle region, as illustrated in section 410. In the mid region of the substrate, the least amount of losses may occur, as well as the best coupling with the radiation shield. Consequently, the temperature may be highest in this region, as may be the film thickness. This may also impact the extinction coefficient of the film, which may then vary across the film between the central, middle, and edge regions. A third, and random, affect may include a chamber signature, which may also impact any aspect of the temperature profile and distribution within the chamber. To compensate for all of these effects, some embodiments of the present technology may modify a radiation shield to affect temperature distributions across the substrate.

Figure 5A:
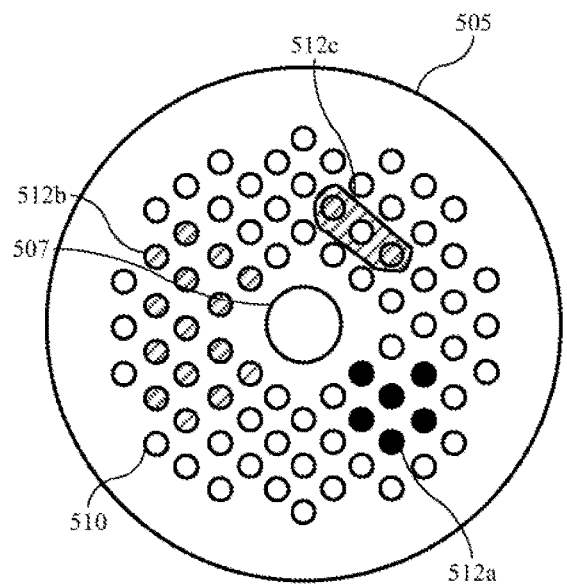
FIGS. 5A-5B show schematic top plan views of exemplary radiation shields according to some embodiments of the present technology.
Figure 5B:
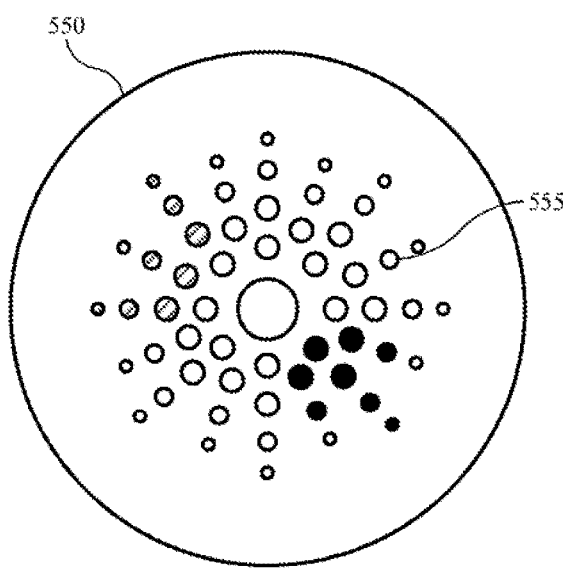

FIGS. 5A-5B show schematic top plan views of exemplary radiation shields according to some embodiments of the present technology. The radiation shields may be included in any chamber or system previously described, as well as any other chamber or system that may benefit from the shielding. The radiation shields may include a number of apertures defined through the shield. The apertures may control a heat distribution from the pedestal, and may provide controlled heat loss, which may facilitate improved uniformity of temperature across the substrate. The apertures may provide a view factor to the cooler chamber base, which may provide an amount of radiative cooling. While this cooling may be relatively small at lower processing temperatures, although still present, the controlled emission path may facilitate temperature control at higher temperature processing. The radiation shield may be positioned between about 2 mm and about 30 mm from the bottom of the platen, and the aperture pattern may be produced to provide heat draining from higher temperature areas. The heat shields may be a number of materials, and in some embodiments may be or include ceramic materials.

As illustrated in FIG. 5A, radiation shield 505 may have a central aperture 507, where the shield may be coupled with a pedestal shaft as previously described. It is to be understood that shields according to embodiments may include any number of apertures, and the figures are included non-limiting aperture patterns. For example, shields encompassed by the present technology may define or include greater than or about 25 apertures, and may include greater than or about 50 apertures, greater than or about 75 apertures, greater than or about 100 apertures, greater than or about 125 apertures, greater than or about 150 apertures, greater than or about 175 apertures, greater than or about 200 apertures, greater than or about 225 apertures, greater than or about 250 apertures, greater than or about 275 apertures, greater than or about 300 apertures, greater than or about 325 apertures, greater than or about 350 apertures, greater than or about 375 apertures, greater than or about 400 apertures, or more. The shield may include a first aperture pattern, where the apertures 510 may be similarly sized across the heat shield. The apertures may be distributed in a uniform pattern within a middle region of the shield 505. For example apertures 510 may begin radially outward from central aperture 507 a first distance. As illustrated, a first radial distance where the shield may be solid or define no apertures may extend between the innermost apertures and the central aperture, which may accommodate the heat losses that may occur from the shaft. Similarly, the outermost apertures may not extend towards an end region of the shield where the shield may remain solid or define no apertures, which may accommodate the heat losses that may occur from the sidewalls.

Accordingly, the innermost apertures may be maintained an outward distance from an outer diameter of the central aperture that is greater than or about 1% of a radius of the shield, and may be greater than or about 2% of a radius of the shield, greater than or about 3% of the radius, greater than or about 4% of the radius, greater than or about 5% of the radius, greater than or about 6% of the radius, greater than or about 7% of the radius, greater than or about 8% of the radius, greater than or about 9% of the radius, greater than or about 10% of the radius, or greater.

Additionally, the outermost apertures may be maintained an inward distance from an external edge of the shield that is greater than or about 1% of a radius of the shield, and may be greater than or about 2% of a radius of the shield, greater than or about 3% of the radius, greater than or about 4% of the radius, greater than or about 5% of the radius, greater than or about 6% of the radius, greater than or about 7% of the radius, greater than or about 8% of the radius, greater than or about 9% of the radius, greater than or about 10% of the radius, greater than or about 12% of the radius, greater than or about 14% of the radius, greater than or about 16% of the radius, greater than or about 18% of the radius, greater than or about 20% of the radius, greater than or about 25% of the radius, greater than or about 30% of the radius, greater than or about 35% of the radius, greater than or about 40% of the radius, greater than or about 45% of the radius, greater than or about 50% of the radius, or greater. Consequently, the plurality of apertures may be defined within an annular area about the shield confined by a radial distance of less than or about 95% of a radius of the shield, and may be confined by a radial distance of less than or about 90% of a radius, less than or about 85%, less than or about 80%, less than or about 75%, less than or about 70%, less than or about 65%, less than or about 60%, less than or about 55%, less than or about 50%, less than or about 45%, less than or about 40%, less than or about 35%, less than or about 30%, less than or about 25%, less than or about 20%, less than or about 15%, or less.

The apertures may be characterized by any diameter, and may be similarly sized, or characterized by different sizes, as illustrated in FIG. 5B, where shield 550 may have apertures 555 sized along a gradient. Any gradient may be used, and in some embodiments the apertures proximate the shaft may be characterized by a larger diameter than apertures distal to the shaft, although the reversed gradient may also be used. Additionally, apertures proximate the central aperture, and proximate the shield edge may be characterized by a smaller diameter than apertures nearer a midpoint along a radius of the shield.

As noted the apertures may be characterized by any diameter, and any of the apertures may be characterized by a diameter greater than or about 2 mm in some embodiments. The apertures may be characterized by a diameter greater than or about 2.5 mm, greater than or about 3.0 mm, greater than or about 3.5 mm, greater than or about 4.0 mm, greater than or about 4.5 mm, greater than or about 5.0 mm, greater than or about 5.5 mm, greater than or about 6.0 mm, greater than or about 6.5 mm, greater than or about 7.0 mm, greater than or about 7.5 mm, greater than or about 8.0 mm, greater than or about 8.5 mm, greater than or about 9.0 mm, or greater. However, as apertures increase beyond a threshold, the amount of loss may create an effect on the substrate, such as a shadow of the aperture expressed in the film formation. Accordingly, in some embodiments the apertures may be characterized by a diameter of less than or about 10.0 mm, and may be characterized by a diameter of less than or about 9.5 mm, less than or about 9.0 mm, less than or about 8.5 mm, less than or about 8.0 mm, less than or about 7.5 mm, less than or about 7.0 mm, or less. Both the sizing and distribution of holes may limit effects on the wafer in some embodiments.

As explained previously, some non-uniformity aspects may be planar as opposed to radial, and chamber signatures may also provide non-uniformity about a substrate. Accordingly, in some embodiments, shields according to some embodiments of the present technology may be characterized by masks, such as one or more blocks 512, which may be seated in an aperture of the shield, may extend across an aperture of the shield, or may cover an aperture of the shield. The blocks may allow further tuning of the radiative losses distributed from the shield. For example, where a planar loss may occur, such as proximate a slit valve in the chamber housing, one or more blocks may be included in the shield to limit losses, which may overcome or at least partially correct the planar effect. The blocks may be a material that may be substantially opaque to infrared radiation, such as alumina, or some other material which may block infrared radiation losses. For example, blocks 512a, may be opaque to radiative emissions.

The blocks may also be partially or substantially transparent to radiative emissions, such as blocks 512b. For example, quartz, sapphire, or other materials that may permit infrared transmission may be used in some apertures. As explained previously, a purge gas may be flowed between the radiation shield and the platen. When apertures are included within the radiation shield, the purge gas may flow through the apertures, and deposition precursors may not be sufficiently blocked from the region, and may deposit materials difficult to clean. By including more transparent blocks, the targeted heat loss may still be provided, while maintaining the purge through the region. As illustrated by block 512c, larger blocks may extend across multiple apertures in any arrangement, and may include plugs extending into some or all apertures being covered. Shields 505 and 550 are not intended to be limiting, and merely illustrate some of a number of encompassed shield designs and configurations that may provide tuning capability for targeted heat loss in a processing chamber.

Figure 5C:
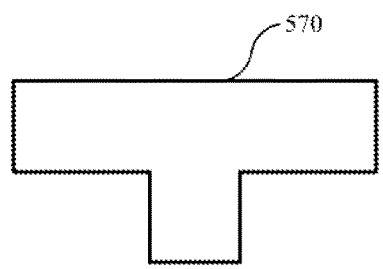
FIG. 5C-5D show schematic elevation views of exemplary shield blocks according to some embodiments of the present technology.
Figure 5D:
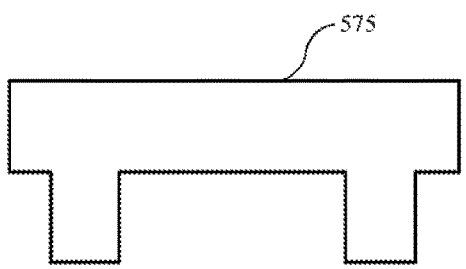

FIG. 5C-5D show schematic elevation views of exemplary shield blocks according to some embodiments of the present technology. The blocks may be any of the transparent or opaque blocks discussed. The blocks are not to be considered limited to any particular shape, but may include a peg or plug portion that may extend within the aperture of the heat shield. For example, block 570 illustrated in FIG. 5C may be positioned in a single aperture, while block 575 illustrated in FIG. 5D may extend across multiple apertures. Block 575 may include plugs that extend into some or all apertures that the block may cover or extend across.

Figure 6:
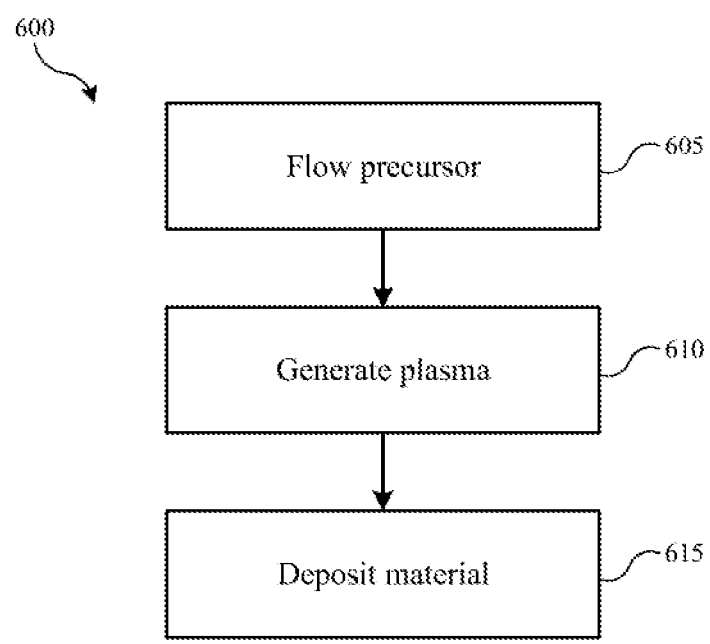
FIG. 6 shows operations of an exemplary method of semiconductor processing according to some embodiments of the present technology.

FIG. 6 shows operations of an exemplary method 600 of semiconductor processing according to some embodiments of the present technology. The method may be performed in a variety of processing chambers, including processing system 200 described above, which may include radiation shields according to embodiments of the present technology, such as any shield discussed previously. Method 600 may include a number of optional operations, which may or may not be specifically associated with some embodiments of methods according to the present technology.

Method 600 may include a processing method that may include operations for forming a hardmask film or other deposition operations. The method may include optional operations prior to initiation of method 600, or the method may include additional operations. For example, method 600 may include operations performed in different orders than illustrated. In some embodiments, method 600 may include flowing one or more precursors into a processing chamber at operation 605. For example, the precursor may be flowed into a chamber, such as included in system 200, and may flow the precursor through one or more of a gasbox, a blocker plate, or a faceplate, prior to delivering the precursor into a processing region of the chamber. In some embodiments the precursor may be or include a carbon-containing precursor.

In some embodiments, a radiation shield may be included in the system about the substrate support, such as about a shaft portion, where a substrate is positioned on a platen positioned above the shield. Any of the other characteristics of radiation shields described previously may also be included, including any aspect of shields 505 or 550, such as that one or more blocks may be included in apertures defined through the shield. At operation 610, a plasma may be generated of the precursors within the processing region, such as by providing RF power to the faceplate to generate a plasma. Material formed in the plasma, such as a carbon-containing material, may be deposited on the substrate at operation 615.

In some embodiments, testing on the substrate may be performed subsequent processing. Based on an effect on the substrate, one or more blocks may be adjusted on the radiation shield, prior to processing a subsequent substrate. This may provide feed-forward control of processing, which may limit losses from non-uniformity due to chamber effects. The substrate support may be maintained at a temperature of greater than or about 600° C., or any other temperature discussed previously during the process. By utilizing radiation shields and/or shield blocks as described above, the present technology may provide a tunable heat shield, which may be modified with blocks to produce a variety of targeted temperature loss configurations. These configurations may allow selective tuning of processes, as well as reconfigurations based on adjustments to block placements between processes, if needed.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system comprising:
a chamber body comprising sidewalls and a base;
a substrate support extending through the base of the chamber body, wherein the substrate support comprises:
a support platen configured to support a semiconductor substrate, and
a shaft coupled with the support platen;
a shield coupled with the shaft of the substrate support, wherein:
the shield is characterized by a first surface that faces the support platen and a second surface that is opposite the first surface; and
the shield comprises a plurality of apertures defined through the shield, each aperture of the plurality of apertures extending through both the first surface and the second surface; and
a block seated in and closing off an aperture of the plurality of apertures of the shield.

2. The semiconductor processing system of claim 1, wherein the shield comprises a ceramic material.

3. The semiconductor processing system of claim 1, wherein the substrate support further comprises a purge channel positioned to deliver a purge gas within a region between the support platen and the shield.

4. The semiconductor processing system of claim 1, wherein each aperture of the plurality of apertures is characterized by a diameter of less than or about 10 mm.

5. The semiconductor processing system of claim 4, wherein the plurality of apertures are sized along a gradient, and apertures proximate the shaft are characterized by a larger diameter than apertures distal the shaft.

6. The semiconductor processing system of claim 1, wherein the plurality of apertures are defined within an area confined by a radial distance of 80% or less of a radius of the shield.

7. The semiconductor processing system of claim 1, wherein the shield is positioned within 30 mm along the shaft of a backside of the support platen.

8. The semiconductor processing system of claim 1, wherein the block comprises a material that is substantially opaque to infrared radiation.

9. The semiconductor processing system of claim 8, wherein the block comprises a first block, wherein the aperture of the shield in which the first block is seated is a first aperture, and wherein the semiconductor processing system further comprises a second block seated in a second aperture of the shield.

10. The semiconductor processing system of claim 9, wherein the second block comprises a material that is substantially transparent to infrared radiation.

11. A semiconductor processing chamber pedestal radiation shield, comprising:
a ceramic material; and
a block, wherein:
the shield defines a central aperture coaxial with a central axis of the shield,
the shield is characterized by a first surface and a second surface that is opposite the first surface, the first surface and the second surface being orthogonal relative to the central axis of the shield;
the shield defines a plurality of apertures uniformly spaced about the central aperture, each aperture of the plurality of apertures extending through both the first surface and the second surface,
the block extends across and covers at least one aperture of the plurality of apertures, and
the plurality of apertures are defined within an area confined by a radial distance of 90% or less of a radius of the shield.

12. The semiconductor processing chamber pedestal radiation shield of claim 11, wherein the block comprises a material that is substantially opaque to infrared radiation.

13. The semiconductor processing chamber pedestal radiation shield of claim 11, wherein the block extends across multiple apertures of the plurality of apertures.

14. The semiconductor processing chamber pedestal radiation shield of claim 11, wherein the block comprises a first block, wherein the at least one aperture across which the first block extends is a first aperture, and wherein the shield further comprises a second block extending across a second aperture of the plurality of apertures of the shield.

15. The semiconductor processing chamber pedestal radiation shield of claim 14, wherein the second block comprises a material that is substantially transparent to infrared radiation.

16. The semiconductor processing chamber pedestal radiation shield of claim 15, wherein the second block comprises quartz or sapphire.

17. A method of semiconductor processing comprising:
flowing a carbon-containing precursor into a processing chamber, wherein the processing chamber comprises a faceplate and a substrate support on which a substrate is disposed, wherein the substrate support extends through a base of the processing chamber, wherein the substrate support comprises:
a support platen on which the substrate is disposed,
a shaft coupled with the support platen,
a shield coupled with the shaft of the substrate support, wherein:
the shield is characterized by a first surface that faces the support platen and a second surface that is opposite the first surface; and
the shield comprises a plurality of apertures defined through the shield, each aperture of the plurality of apertures extending through both the first surface and the second surface, and
a block covering and closing off at least one aperture of the plurality of apertures;
generating a plasma of the carbon-containing precursor within the processing chamber; and
depositing a carbon-containing material on the substrate.

18. The method of semiconductor processing of claim 17, wherein the substrate support is maintained at a temperature of at least about 600° C. during the method.

19. The method of semiconductor processing of claim 17, wherein the block comprises a material that is substantially opaque to infrared, and wherein the block increases a local temperature of the substrate support at a location vertically offset and axially aligned with the block.

20. The method of semiconductor processing of claim 17, wherein the block comprises a first block, wherein the at least one aperture covered by the first block is a first aperture, wherein the substrate support further comprises a second block covering a second aperture of the shield, wherein the second block comprises a material that is substantially transparent to infrared radiation, and wherein the second block decreases a local temperature of the substrate support at a location vertically offset and axially aligned with the second block.

\* \* \* \* \*